(12) United States Patent
De Brito et al.

(10) Patent No.: US 12,043,138 B2
(45) Date of Patent: Jul. 23, 2024

(54) METHOD FOR OPERATING A BATTERY SYSTEM OF A VEHICLE AND A VEHICLE COMPRISING A BATTERY MANAGEMENT SYSTEM

(71) Applicant: VOLVO TRUCK CORPORATION, Gothenburg (SE)

(72) Inventors: David De Brito, Charvieu-chavagneux (FR); Grégoire Artur Du Plessis, Greensboro, NC (US); Romain Rimboud, Lyons (FR); Jean Daniel Bonnet, High Point, NC (US)

(73) Assignee: VOLVO TRUCK CORPORATION, Gothenburg (SE)

(*) Notice: Subject to any disclaimer, the term of this patent is extended or adjusted under 35 U.S.C. 154(b) by 856 days.

(21) Appl. No.: 16/969,055

(22) PCT Filed: Feb. 12, 2018

(86) PCT No.: PCT/IB2018/000219
§ 371 (c)(1),
(2) Date: Aug. 11, 2020

(87) PCT Pub. No.: WO2019/155247
PCT Pub. Date: Aug. 15, 2019

(65) Prior Publication Data
US 2021/0031652 A1 Feb. 4, 2021

(51) Int. Cl.
*B60L 58/10* (2019.01)
*B60L 58/12* (2019.01)
(Continued)

(52) U.S. Cl.
CPC ............ *B60L 58/10* (2019.02); *G01R 31/367* (2019.01); *G01R 31/371* (2019.01);
(Continued)

(58) Field of Classification Search
CPC ... B60L 58/10; B60L 2200/44; G01R 31/367; G01R 31/371; H01M 10/425; H01M 2010/4271; H01M 2220/20
See application file for complete search history.

(56) References Cited

U.S. PATENT DOCUMENTS

2010/0216521 A1* 8/2010 Wu .................. H04W 52/0258
455/572

FOREIGN PATENT DOCUMENTS

| EP | 2506025 A1 | 10/2012 |
|---|---|---|
| EP | 3048694 A1 | 7/2016 |
| KR | 20160092733 A | 8/2016 |

OTHER PUBLICATIONS

International Search Report and Written Opinion dated Nov. 20, 2018 in corresponding International PCT Application No. PCT/IB2018/000219, 11 pages.

* cited by examiner

*Primary Examiner* — Adam A Arciero
(74) *Attorney, Agent, or Firm* — Venable LLP; Jeffri A. Kaminski

(57) ABSTRACT

A vehicle comprises a battery management system (2) including an electronical control unit (3), a battery system (6) and an electronic battery controller (4). The battery controller (4) includes an acquisition device (43) for acquiring values of at least one electrical parameter of the battery system (6) and a memory (42) storing a battery profile (44) representative of properties of the battery system (6). The electronical control unit (3) includes: —a storage space (34) including a plurality of additional battery profiles (35), —a selection interface (33) for selecting a replacement battery profile among the plurality of additional battery profiles (35). and is programmed to replace the battery profile (44)

(Continued)

stored in the memory (42) with the replacement battery profile selected by the selection interface (33).

7 Claims, 2 Drawing Sheets

(51) Int. Cl.
    *B60L 58/16*         (2019.01)
    *G01R 31/367*      (2019.01)
    *G01R 31/371*      (2019.01)
    *G01R 31/382*      (2019.01)
    *G01R 31/392*      (2019.01)
    *H01M 10/42*       (2006.01)

(52) U.S. Cl.
    CPC ........... *H01M 10/425* (2013.01); *B60L 58/12* (2019.02); *B60L 58/16* (2019.02); *B60L 2200/44* (2013.01); *G01R 31/382* (2019.01); *G01R 31/392* (2019.01); *H01M 2010/4271* (2013.01); *H01M 2220/20* (2013.01)

METHOD FOR OPERATING A BATTERY SYSTEM OF A VEHICLE AND A VEHICLE COMPRISING A BATTERY MANAGEMENT SYSTEM

CROSS-REFERENCE TO RELATED APPLICATIONS

This application is a U.S. National Stage application of PCT/IB2018/000219, filed Feb. 12, 2018, and published on Aug. 15, 2019, as WO 2019/155247 A1, all of which is hereby incorporated by reference in its entirety.

TECHNICAL FIELD OF THE INVENTION

The invention relates to a method for operating a battery management system in a vehicle and also relates to a vehicle comprising this battery management system. The invention more generally relates to the management of electrical batteries in vehicles, especially in road vehicles such as industrial vehicles.

BACKGROUND OF THE INVENTION

Electrical batteries are used in many road vehicles, usually to power auxiliary elements of the vehicle, such as safety devices, heating, ventilation and air conditioning devices, lighting devices, braking devices or infotainment devices.

These electrical batteries are usually associated to a battery management system, which includes an electronic battery controller connected to a battery and programmed to monitor and evaluate properties such as the charging state and the health state of the battery. This data is communicated to an electronic control unit of the vehicle, which is programmed to take action in the event of any abnormal behavior of the battery.

Generally, the battery controller measures electrical values of the battery (such as an electrical current, or an electrical voltage) and calculates indicators which are representative of the health state and/or the charging state of the battery. This calculation is performed using a predefined battery calibration data set, such as a battery profile. This battery profile is usually provided by the manufacturer of the battery.

In some circumstances, the actual electrical behavior of the battery may become significantly different than the theoretical behavior defined in the battery profile. For example, the properties of the battery may deteriorate over time due to battery wear or ageing. The battery can also be replaced, for example during maintenance operations or after a battery failure, by a new battery model or by a new battery built by a different manufacturer. The properties of this new battery may be significantly different than those of the original battery.

The battery profile must then be updated in consequence. Otherwise, if the battery controller relies on a battery profile which does not correspond to the battery in use, then the properties calculated by the battery controller, such as the charging state and the health state, may become inaccurate. This may adversely affect the operation of the battery management system and of the vehicle as a whole.

Usually, a small number of factory-set default battery profiles are recorded permanently in the battery controller by the manufacturer. The battery controller is programmed to select, among this plurality of built-in battery profiles, an adequate battery profile corresponding to the behavior of the battery to which it is connected. However, for practical and industrial reasons, the memory size of the battery controller is very limited, making it difficult to store a large number of battery profiles. It is therefore likely that, during the lifetime of the vehicle, the battery response and behavior may change to such a degree that there will be no corresponding battery profile available among the built-in battery profiles. This situation is not desirable.

SUMMARY OF THE INVENTION

The object of the present invention is therefore to provide a vehicle comprising a battery management system in which the management of battery profiles is improved in order to overcome the above drawbacks.

To that end, the invention relates to the vehicle as defined in claim 1.

An advantage of the invention is that since the additional battery profiles are stored in the electronic control unit connected to the battery controller, the battery, controller can be updated directly for the electronic control unit without having to change the entire battery controller.

According to advantageous embodiments, the invention may optionally comprise one or more of the features defined in dependent claims 2 to 6.

According to another aspect, the invention relates to a method for operating a battery management system in a vehicle as defined in claim 7.

BRIEF DESCRIPTION OF THE DRAWINGS

The invention will be better understood upon reading the following description, provided solely as an example, and made in reference to the appended drawings, in which.

DETAILED DESCRIPTION OF SOME EMBODIMENTS

Figure 1:
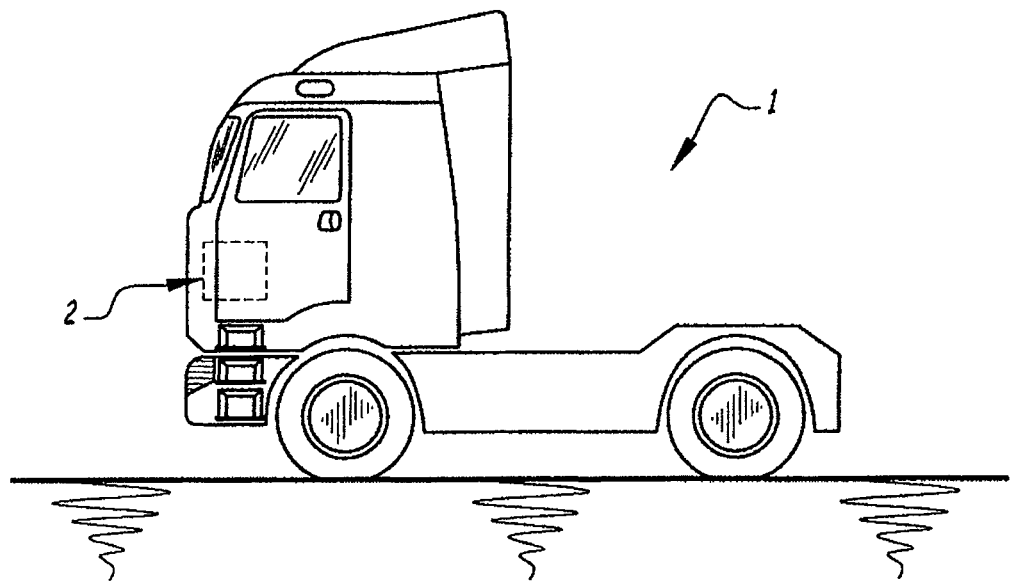
FIG. 1 is an illustration of a vehicle comprising a battery system according to embodiments of the invention.

FIG. 1 illustrates a vehicle 1 comprising a battery management system 2. For example, the vehicle 1 is a road vehicle, such as a semi-trailer truck. However, the vehicle 1 can be any industrial vehicle, preferably a wheeled industrial vehicle, such as a tractor, a dump truck, a military vehicle, a heavy duty construction vehicle such as a loader, a bulldozer, an excavator, a compactor, a scraper or any equivalent vehicle.

It is therefore understood that the semi-trailer truck 1 is merely an exemplary embodiment of an industrial vehicle, and that the embodiments and advantages of the invention described in what follows can be adapted mutatis mutandis to any other type of industrial vehicle.

Figure 2:
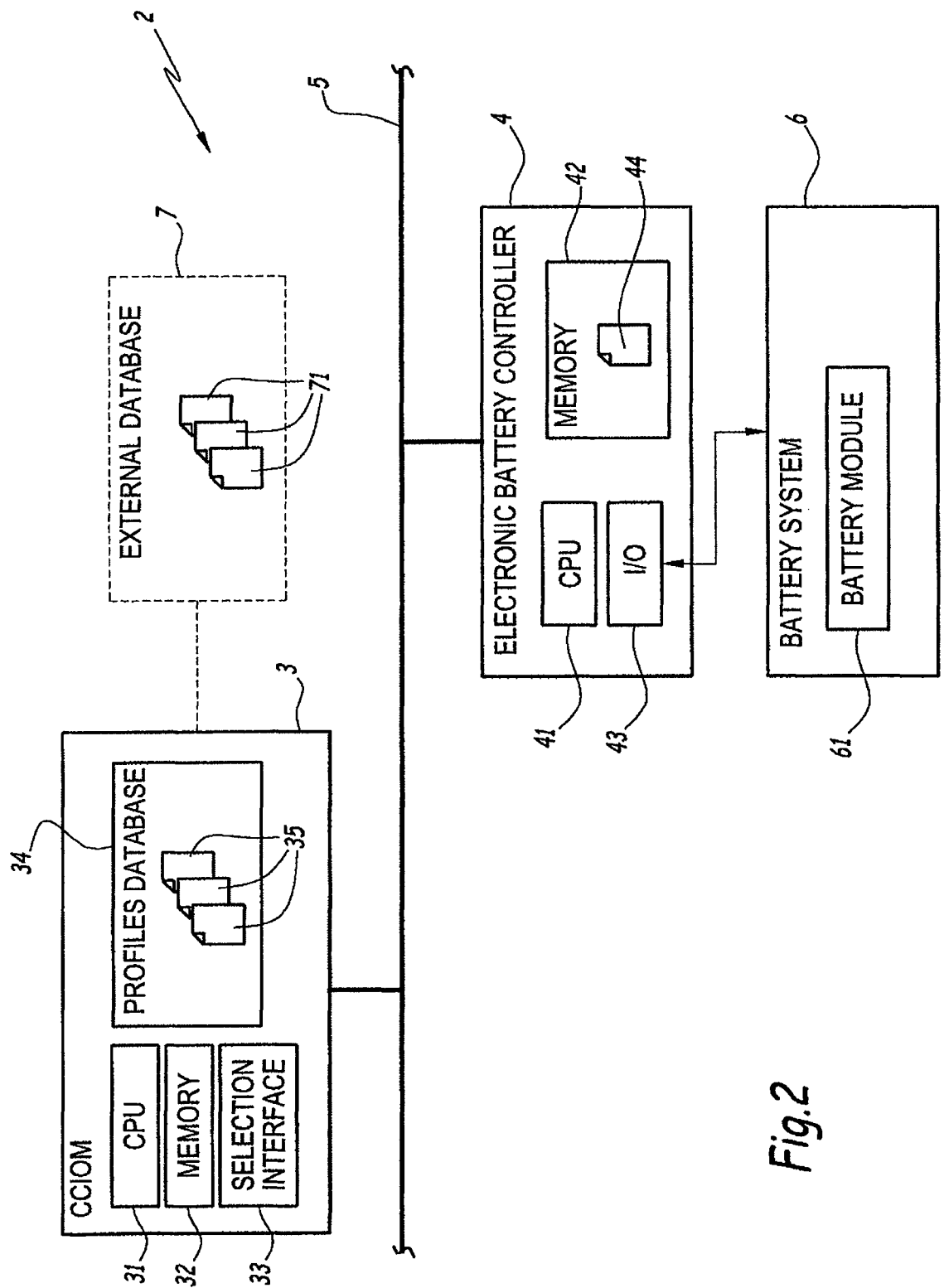
FIG. 2 is a block diagram of an example of a battery management system for the vehicle of FIG. 1 according to embodiments of the invention.

As illustrated in FIG. 2, the battery management system 2 includes an electronic control unit 3, an electrical battery system 6, an electronic battery controller 4 and a communication bus 5.

The vehicle 1 also includes at least one chassis-related electrically powered device, which is not illustrated here, meant to provide auxiliary functions of the vehicle 1, more preferably a chassis-related function of the vehicle 1. This chassis-related device may be an electro-mechanical device, or a pneumatic device, or an electrical device or a hydraulic device. Examples of such chassis-related functions include lighting, braking, safety, infotainment, heating, ventilation and air conditioning or any similar functions. In this example, these chassis-related devices do not include traction or propulsion engines of the vehicle 1.

The electronical control unit 3, abbreviated "ECU", includes a central processing unit 31 (CPU), at least one computer memory 32 comprising instructions for implementing a selection interface 33, and a database 34 for storing additional battery profiles 35, whose role will be explained in what follows. The ECU 3 may also be named "Central Chassis Input-Output Module" (CCIOM) in what follows.

The ECU 3 is operatively coupled to the bus 5. For example, the ECU 3 includes a data communication interface connected to the bus 5 through a wired link.

The bus 5 is a wired vehicle bus allowing exchange of data across the vehicle 1. In some embodiments, the bus 5 is a Local interconnect Network bus (LIN). In alternative embodiments, the bus 5 may be defined according to a different topology and/or to a different standard, such as the Controller Area Network bus (CAN). The bus 5 may alternatively be a wireless vehicular network.

For example, the chassis-related device(s) is (are) connected to the bus 5 in communication with the ECU 3. The ECU may drive and/or monitor the chassis-related device(s). In other words, the ECU 3 is not necessarily limited to battery management functions and may oversee the behavior of the chassis of the vehicle.

The central processing unit 31 is able to execute executable instructions stored in the memory 32. For example, the CPU 31 is a programmable microcontroller or a microprocessor.

The memory 32 is a non-volatile computer memory (e.g. a non-transitory computer-readable medium), for example including one or several memory modules of the Electrically-erasable programmable read-only memory (EEPROM) technology or the Flash technology, or of any appropriate data storage technology.

The battery system 6 is configured so as to provide electrical power to at least some of the chassis-related devices of the vehicle 1, for example by means of a power delivery bus, not illustrated or, alternatively, through the data bus 5. To this end, the battery system 6 is adapted to store energy and to transfer at least some of this energy towards said chassis-related devices. The battery system 6 may also power the ECU 3 and the battery controller 4.

The battery system 6 includes battery cells 61, also named battery modules 61, and may include power conversion means and/or commendable power regulation means, not illustrated, in order to regulate the delivered electrical power.

In the illustrated embodiment of FIG. 2, only one battery cell 61 is depicted. However, this is done only for illustrative purposes and, in practice, any number of battery cells 61 may be connected inside the battery system 6.

The battery cells 61 may be removable. Preferably, the battery cells 61 are rechargeable. For example, the energy storage technology used in the battery cells 61 is of the nickel-metal hydride type, or the lithium-ion type, or the lead-acid type, or any other appropriate automotive battery technology.

The battery controller 4, also named "battery management device" (BMD) is configured to evaluate and monitor properties of the battery system 6, such as the state of charge and/or the state of health of the battery system 6 or, more precisely, of one or several of the battery cells 61. The battery controller 4 is also programmed to forward this information to the ECU 3 through the bus 5. For example, the ECU 3 is connected to the battery controller 4 through the bus 5 and is adapted to control the behavior of the chassis-related devices and/or the behavior of the vehicle 1 depending on the value(s) of the battery-related properties monitored and forwarded by the battery controller 4.

According to some embodiments, the battery controller 4 includes a CPU 41, a computer memory 42 and a device 43 for acquiring at least one electrical value of the battery system 6. The CPU 41 is able to execute instructions stored in the memory 42. For example, the CPU 41 is a programmable micro controller. The memory 42 is a non-volatile computer memory (e.g. a non-transitory computer-readable medium), for example including one or several memory modules of EEPROM technology, or Flash technology, or, alternatively, of any appropriate data storage technology.

In this example, the size of the memory 42 is limited, for example is less than 1 MB or less than 512 kB. The size of the memory 42 is lower than the size of the memory 32 of the ECU 3, for example five times lower or ten times lower than the size of memory 32.

The memory 42 stores, among other things, a battery profile 44. For example, the memory 42 comprises a slot, that is to say a predefined memory space that is meant to host a battery profile 44. For example, the battery profile 44 takes the form of a digital data structure recorded into memory 42. Preferably, the battery controller 4 is setup so that no more than one battery profile 44 can be stored inside the memory 42. In other words, while the memory 42 may store additional data and/or instructions, it is not meant to store more than one battery profile 44.

The battery profile 44 is a calibration data set representative of the electrical properties and response of the battery system 6. For example, the battery profile 44 gives a correspondence between at least one measurable electrical value of the battery (such as output electrical voltage, output electrical current, electrical resistance, etc.) and at least one indicator representative of the physical state of the battery (such as the State of Charge, State of Health, etc.)

In this example, the battery controller 4 measures one or several electrical properties of the battery system 6 using the device 43. For example, the device 43 includes a measurement sensor connected to the battery system 6, such as a current sensor for measuring output current, or a voltage sensor for measuring output voltage, or any other adequate sensor, or a combination of such sensors. Alternatively, the sensor(s) may be located inside the battery system 6. In this case, the device 43 includes a data acquisition interface connected to the sensor(s), such as an analog-to-digital converter.

The battery controller 4 is programmed to automatically calculate said indicator(s) using the data acquired through the device 43 and using calibration data defined by the battery profile 44. For example, this calculation is done by the CPU 41 using executable instructions recorded inside the memory 42.

For example, the additional battery profiles 35 are similar to the battery profile 44, except that they define calibration data corresponding to batteries of a different model, and/or to batteries built by a different manufacturer, or batteries using a different energy storage technology, or batteries similar to the battery 6 but having different levels of wear.

The storage space 34 in which the additional battery profiles 35 are stored may be located inside the memory 32

(e.g. it is a region of the memory 32) or inside a dedicated data storage medium embedded in the ECU or connected to the ECU. Storage space 34 is named "profiles database" in what follows, although the additional battery profiles 35 are not necessarily stored into a relational database.

The selection interface 33 allows the replacement of the current battery profile (i.e. in this example, of the battery profile 44) by a replacement battery profile selected among the additional battery profiles 35. This selection may be performed automatically, in which case the selection interface 33 is adapted to detect a change of battery performance triggering a need to replace the current battery profile 44. This selection may also be done at the request of a user, by acquiring a replacement command received from a user, in which case the selection interface 33 is adapted to acquire such a command and, in response, to initiate a procedure for replacing the current battery profile 44 with the selected battery profile.

For example, the ECU 3 is adapted to be connected to an external computing maintenance device such as an automotive diagnostic board of an automotive workshop, a computer or a mobile communication device (such as an electronic tablet or a smartphone). For example, the connection with the external computing maintenance device is established through a connection interface compliant with the On-Board Diagnosis standard (OBD) or with the "OBD 2" standard.

This connection is preferably established over the bus 5, although in other embodiments, the ECU may comprise a dedicated connection interface allowing a direct connection bypassing the bus 5.

In some embodiments, the ECU 3 is also capable of being connected to an external database 7, comprising supplementary battery profiles 71. At least some of these supplementary battery profiles 71 may be copied or transferred into the database 34 in order to obtain extra additional battery profiles 35. For example, the external database 7 is hosted by a remote computer server connected to the ECU 3 or connected to the external maintenance device itself directly or indirectly connected to the ECU 3.

Figure 3:
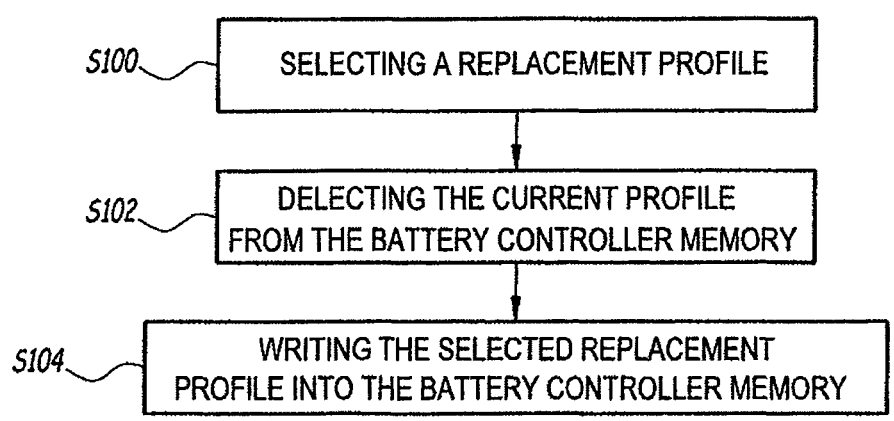
FIG. 3 is a flow chart illustrating an example of operation of the battery management system of FIG. 2 according to embodiments of the invention.

An exemplary procedure for replacing the battery profile 44 is now described in reference to FIG. 3.

Initially, the battery profile 44 is stored in the memory 42 and is used by the battery controller 40 as the current battery profile.

During a step S100, a replacement battery profile is automatically selected among one of the profiles 35 of the profile data base 44 by the selection interface 33. For example, a selection order is received from the interface 33 to select one of the additional profiles 35, in response to a selection order sent by a user through a human-machine interface in the external maintenance device.

Then, the ECU 3 commands the replacement of the current profile 44 with the selected replacement profile 35. For example, the CPU 31 sends an order through the bus 5 to the CPU 41 to delete the current profile 44 from the memory 42. In response, during a step S102, the CPU 41 deletes the current profile 44 from the memory 42.

Then, once this deletion is completed, the ECU 3 sends the replacement profile 35 towards the CPU 41 over the bus 5.

During a step S104, the selected replacement battery profile is automatically written into the memory 42 of the battery controller 4. For example, the CPU 41 writes the selected replacement profile into the memory 42, here in the dedicated memory slot of memory 42.

In some embodiments, once the replacement operation is successfully completed, the ECU 3 automatically sends a success notification to the external maintenance device.

In case of failure to successfully complete one of the steps S100, S102 or S104, the ECU 3 may automatically send an error message to the external maintenance device in order to notify the user of the failure to replace the battery profile 44. A predefined error-handling procedure may then be implemented by the ECU 3 or by the external maintenance device.

For example, the replacement method described above is implemented in a production line, during steps of manufacturing the vehicle 1. The selection is done automatically based on the type of battery mounted by default in factory in the vehicle 1. More precisely, the additional profiles 35 may correspond to different battery models that are likely to be installed in the vehicle 1 during fabrication. When the battery is installed, the appropriate battery profile is selected in replacement of the default profile 44.

In other embodiments, this method is performed using an after-market tool in a maintenance workshop, for example when the battery system 6 or when battery module 61 need to be replaced.

The embodiments of the battery management system 2 advantageously improve the management of battery profiles, by making it possible to directly update the battery controller 4 with replacement battery profiles which are stored outside the battery controller 4. Since the memory 32 of the ECU 3 does not have the same size constraints and limitations as the embedded memory 42 of the battery controller 4, many more battery profiles can be stored in the ECU 3 than in known battery controllers. A consequence is that there is less risk to be in a situation where no corresponding battery profile is available among the replacement battery profiles. Even if such a situation were to occur, the profiles database 34 of the ECU 3 can be itself updated from an external database, meaning that even more additional profiles can be downloaded. An additional advantage is that, since the replacement of the profiles is driven by the ECU 3, this method can be implemented in existing battery management systems without having to completely modify the architecture of the battery controller 4.

The embodiments and alternatives described above may be combined with each other in order to generate new embodiments of the invention.

The invention claimed is:

1. A vehicle comprising a battery management system including an electronic control unit, a battery system and an electronic battery controller,
    wherein the battery controller includes an acquisition device for acquiring values of at least one electrical parameter of the battery system and an internal memory storing a battery profile representative of properties of the battery system, the battery controller being programmed to calculate at least one indicator representative of an internal state of the battery system, said computation being performed from the measured values of the at least one physical parameter and from the battery profile,
    wherein the electronic control unit is connected to the battery controller in order to acquire the at least one indicator calculated by the battery controller,
    wherein the electronical control unit includes:
        a storage space, separate from the internal memory of the battery controller, storing a plurality of pre-determined, additional battery profiles,
        a selection interface for selecting a replacement battery profile from among the plurality of pre-determined, additional battery profiles, whereby the selection is done at the request of a user, by acquiring a replacement command received from the user, and wherein the electronic control unit is programmed to replace the battery profile stored in the memory of the battery controller with the replacement battery profile selected by the selection interface.

2. The vehicle of claim 1, wherein the vehicle further comprises a communication bus, the electronic control unit and the battery controller being operatively connected to each other through the communication bus.

3. The vehicle according to claim 1, wherein the selection interface is a human machine interface adapted to acquire a selection command emanating from an external maintenance device, and is further adapted to select the replacement battery profile on the basis of the acquired selection command.

4. The vehicle according to claim 1, wherein electronic control unit is adapted to be connected to a remote external database comprising a plurality of supplementary battery profiles, and wherein the electronic control unit is adapted to download at least one of the supplementary battery profiles into the storage space.

5. The vehicle according to claim 1, wherein the vehicle is an industrial vehicle.

6. The vehicle according to claim 1, wherein the electronic control unit is adapted to command the operation of at least one device belonging to a chassis of the vehicle, and wherein the battery system is adapted to power said at least one device.

7. A method for use in a battery management system of a vehicle, the battery system management system including an electronic control unit, a battery system and an electronic battery controller, wherein the method comprises:

acquiring a replacement command from a user and selecting a replacement battery profile for replacing a battery profile stored in an internal memory of the battery controller, the acquisition being performed by a selection interface of the electronic control unit, the replacement battery profile being selected among a plurality of pre-determined, additional battery profiles stored in a storage space, separate from the internal memory, of the electronic control unit, replacing automatically the battery profile stored in the internal memory of the battery controller with the selected replacement battery profile.

* * * * *